United States Patent [19]
Fujimaki

[11] Patent Number: 5,442,302
[45] Date of Patent: Aug. 15, 1995

[54] METHOD AND APPARATUS FOR MEASURING HIGH-FREQUENCY C-V CHARACTERISTICS OF MIS DEVICE

[75] Inventor: Nobuyoshi Fujimaki, Tokyo, Japan

[73] Assignee: Shin-Etsu Handotai Co., Ltd., Tokyo, Japan

[21] Appl. No.: 171,406

[22] Filed: Dec. 22, 1993

[30] Foreign Application Priority Data

Dec. 24, 1992 [JP] Japan ................... 4-357586

[51] Int. Cl.$^6$ ............................................. G01R 31/00
[52] U.S. Cl. ................................... 324/765; 324/769; 324/766; 324/754
[58] Field of Search ................ 324/769, 766, 765, 754

[56] References Cited

U.S. PATENT DOCUMENTS

| | | | |
|---|---|---|---|
| 4,323,842 | 4/1982 | McGarrity et al. | 324/765 |
| 5,010,294 | 4/1991 | Foell et al. | |
| 5,140,272 | 8/1992 | Nishimatsu et al. | 324/662 |

FOREIGN PATENT DOCUMENTS 2075978 3/1990 Japan .

OTHER PUBLICATIONS

IEICE Transactions on Electronics, "C-V Measurement and Simulation of Silicon-Insulator-Silicon (SIS) Structures for Analyzing Charges in Buried Oxides of Bonded SOI Materials", vol. E75-C, No. 12, pp. 1421-1429, Dec. 1992, Tokyo, Japan.
Solid State Technology, "C-V Plotting: Myths and Methods", vol. 36, No. 1, pp. 57-61, Jan. 1993, U.S.
A. Goetzberger, "Ideal MOS Curves for Silicon", *The Bell System Technical Journal*, Sep. 1966, pp. 1097-1122.
Bruce E. Deal et al., "Characteristics of the Surface-State Charge $(Q_{ss})$ of Thermally Oxidized Silicon", *J. Electrochem. Soc.: Solid State Science*, Mar. 1967, pp. 266-273.

*Primary Examiner*—Kenneth A. Wieder
*Assistant Examiner*—Kourosh Cyrus Khosravi
*Attorney, Agent, or Firm*—Oliff & Berridge

[57] ABSTRACT

A method of measuring the high-frequency C-V characteristics of a MIS (e.g. MOS) device is disclosed. The method comprises the steps of providing the MIS device in a shielding-box shielding the device from an outside electromagnetic light, illuminating the device with a light of a wavelength preventing an induction of excess carriers at the surface of the semiconductor, applying a voltage of a high frequency to a gate electrode of the device, and alternating a sweep direction of the voltage. An apparatus implementing the method is also disclosed. The method and the apparatus accurately measure the MOS capacitance in response to a voltage applied to the gate electrode.

23 Claims, 4 Drawing Sheets

METHOD AND APPARATUS FOR MEASURING HIGH-FREQUENCY C-V CHARACTERISTICS OF MIS DEVICE

BACKGROUND OF THE INVENTION

1. Field of the Invention

The present invention relates to a method and an apparatus for measuring the high-frequency C-V characteristics of a metal-insulator-semiconductor (MIS) device and more particularly to a method and an apparatus for measuring that of a metal-oxide-semiconductor (MOS) device.

2. Description of the Related Art

In obtaining characteristic values of a MIS device, e.g., a MOS capacitor, fabricated from a semiconductor substrate wafer, such as the carrier concentration $N_{sub}$ in the semiconductor substrate, the flat band voltage $V_{fb}$ required for flattening the energy band at the surface of the semiconductor substrate, the threshold voltage $V_{th}$, and the charge density $Q_{ss}$ in the oxide film near the interface between the oxide film and the semiconductor, a high-frequency C-V characteristics is conventionally measured for the relation between the gate voltage and series connected capacitance (hereinafter referred to as MOS capacitance) of a gate oxide and the depletion layer near the semiconductor surface.

In the measurement of the high-frequency C-V characteristics, a voltage response of the MOS capacitance is measured when a voltage is applied to a gate electrode of the MOS device and the sweep direction of the applied voltage is turned from the accumulation to the inversion or vice versa. For example, when the voltage response of the MOS capacitance is measured so that the MOS device is exposed to light from incandescent lamp or fluorescent lamp, it is incorrectly measured.

FIG. 6 shows an actual high-frequency C-V characteristics of the MOS capacitor in solid line when the surface of the MOS capacitor is exposed to light from fluorescent lamp and a theoretical high-frequency C-V characteristics of the MOS capacitor in dotted line (see THE BELL SYSTEM TECHNICAL JOURNAL, September 1966, pp. 1097-1122). As shown in FIG. 6, in the range of inversion region, the MOS capacitance should be in equilibrium but actually increases, so that the actual curve is out of accordance with the theoretical curve. This is the cause that a light energy from fluorescent lamp induces excess minority carriers at the semiconductor surface. Thus, the MOS capacitance cannot be accurately measured under a condition of exposing the MOS capacitor to light from fluorescent or incandescent lamp.

Therefore, a prior-art apparatus of measuring the high-frequency C-V characteristics measures the high-frequency C-V characteristics in a shading and radiation-shielding box i.e. shielding-box. However, the measurement of the high-frequency C-V characteristics in the shielding-box has a drawback described below.

FIG. 7 shows in solid line an actual high-frequency C-V characteristics measured using the shielding box and a theoretical high-frequency C-V characteristics in dotted line. The MOS capacitance should be in equilibrium, i.e., constant. However, it actually decreases in inversion region and is entirely out of accordance with the theoretical curve, as shown in FIG. 7. Since the generation of minority carriers scarcely follow the sweep speed of the applied voltage, the depletion layer width increases with the applied voltage so that the equilibrium is not arrived. Therefore, the prior-art apparatus of measuring the high-frequency C-V characteristics cannot measure an exact MOS capacitance.

This drawback in the high-frequency C-V characteristics measurement is due to the following causes. In case of p-type silicon substrate, when the gate voltage is swept from the accumulation to the inversion, an electric field produced by a negative voltage applied to the gate electrode accumulates majority carriers at the semiconductor surface. This state is the accumulation in which the MOS capacitance consists only of the oxide capacitance and indicates the maximum value. Since the applied voltage to the gate is subsequently gradually increased in magnitude, the majority carriers are depleted at the semiconductor surface. This state is the depletion in which the MOS capacitance consists of the oxide capacitance and the depletion layer capacitance at the semiconductor surface which are connected in series. This capacitance depends on the width of the depletion layer and decreases as the width of the depletion layer increases.

In addition, since a positive voltage applied to the gate electrode is increased, minority carriers are finally induced to yield the inversion layer at the semiconductor surface. This state is the inversion. An energy required for the induction of the minority carriers at the semiconductor surface corresponds to at least the band gap energy. However, when the MOS capacitor is shielded from light, an energy obtained from the gate application voltage is too low to induce the minority carriers. Therefore, the inversion layer is not produced during a gate voltage application time, so that the MOS capacitance cannot go into the equilibrium.

On the other hand, the sweep speed of the gate voltage must be reduced in order to obtain a sufficient energy to induce the minority carriers at the semiconductor surface. For example, a measuring time required up to the equilibrium is at most 1 hr per measurement point, so that the measurement efficiency is greatly reduced. Thus, when the MOS capacitor is shielded from light or exposed to light from incandescent or fluorescent lamp, it is impossible to measure an exact MOS capacitance in inversion since the actual MOS capacitance is not in accordance with the theoretical curve. Consequently, it is difficult to obtain exact physical characteristic values, such as the carrier concentration etc., of the MOS device.

SUMMARY OF THE INVENTION

The present invention overcomes the problems described above.

An object of the present invention is to provide a method and an apparatus for measuring the high-frequency C-V characteristics of a MOS device which promote the induction of minority carriers in the semiconductor and quickly produces the inversion layer and stably maintains the equilibrium of the inversion layer so as to accurately measure the MOS capacitance in response to a voltage applied to a gate electrode of the MOS device.

In order to achieve this object, a first aspect of the present invention in a method of measuring the high-frequency C-V characteristics of a MOS device comprises the steps of illuminating the MOS device with a light of a predetermined or effective wavelength which prevents excess carriers from being generated at a semiconductor surface of the MOS device, and applying a voltage of a high frequency to a gate electrode of the MOS device.

In the first aspect of the present invention, the wavelength is at least 500 nm in case the MOS device is fabricated or derived from a silicon semiconductor.

In the first aspect of the present invention, the wavelength is at least 1200 nm in case the MOS device is fabricated or derived from a germanium semiconductor.

In the first aspect of the present invention, the wavelength is at least 800 nm in case the MOS device is fabricated or derived from a gallium-arsenide semiconductor.

In the first aspect of the present invention, the wavelength is at least 850 nm in case the MOS device is fabricated or derived from an indium-phosphide semiconductor.

A second aspect of the present invention in an apparatus for measuring the high-frequency C-V characteristics of a MOS device comprises a shielding-box shielding the MOS device from an outside electromagnetic radiation, an illuminant provided within the shielding-box and illuminating the MOS device with a light of a predetermined or effective wavelength which prevents excess carriers from being generated at the surface of the semiconductor of the MOS device, and means for applying a voltage of a high frequency to a gate electrode of the MOS device.

In the second aspect of the present invention, the wavelength is at least 500 nm for a MOS device from silicon, at least 1200 nm for a MOS device from germanium, at least 800 nm for a MOS device from gallium-arsenide and at least 850 nm for a MOS device from indium-phosphide, respectively.

In the second aspect of the present invention, the illuminant may comprise a light source and a filter passing a component of a predetermined or effective wavelength of a light from the light source.

A third aspect of the present invention in an apparatus for measuring the high-frequency C-V characteristics of a MOS capacitor comprises a shielding-box shielding the MOS capacitor from an outside electromagnetic radiation, the shielding-box having a top wall and a bottom wall, a support mounted to the interior surface of the bottom wall and supporting the MOS capacitor so that the gate electrode is upper than the back surface of the semiconductor substrate, an illuminant provided within the shielding-box above the support and emitting a light of a wavelength preventing an induction of excess carriers at the surface of the semiconductor substrate to the surface of the MOS capacitor, and a C-V meter applying a voltage of a high frequency to a gate electrode of the MOS device and changing a sweep direction of the voltage of a sweep width, the C-V meter picking up a vector voltage produced across and a vector current passing through the MOS capacitor to measure the MOS capacitance of the MOS capacitor.

In the third aspect of the present invention, the filter may cut off a component of less than 500 nm wavelength and pass a component of at least 500 nm wavelength in case of the MOS capacitor fabricated or derived from silicon semiconductor so that the transmission factor of light of a component of at least 600 nm wavelength is at least 60%.

When the wavelength of the light illuminating the surface of the silicon MOS device is less than 500 nm, excess minority carriers are generated only near the silicon surface since the absorption coefficient of the silicon substrate is great in respect of the light of that wavelength so that the energy of the light of that wavelength generates hole-electron pairs. On the other hand, since the energy gap $E_g$ of the silicon semiconductor is 1.12 eV, the silicon substrate does not absorb a light of more than 1100 nm wavelength and almost no minority carriers are induced. Thus, the present invention restricts the wavelength of the light to 500 nm to 1100 nm in respect of the MOS device fabricated or derived from the silicon wafer.

In the first aspect of the present invention, since the light in a range of wavelengths which prevents the induction of the excess carriers at the semiconductor surface illuminates the surface of the MOS device, the light energy is introduced into a certain depth in the semiconductor to promote the generation of hole-electron pairs and further internal minority carriers. In the situation of generating internal minority carriers, the magnitude of the applied voltage is gradually increased, so that an electric field produced by the gate voltage easily induces the minority carriers to the semiconductor surface. Thus, the generation and the movement of the minority carriers quickly follow the high sweep speed of the voltage applied to the electrode gate, so that a measuring time of the high-frequency C-V characteristics is reduced. In addition, the generation of the excess carriers at the semiconductor surface is prevented, so that a drawback due to the generation of the excess carriers is avoided. Thus, the present invention quickly and accurately measures the MOS capacitance of the MOS device. In addition, the physical characteristic values, such as the carrier concentration $N_{sub}$ in the semiconductor substrate, the flat band voltage $V_{fb}$ required for flattening the energy band at the surface of the semiconductor substrate, the threshold voltage $V_{th}$, and the charge density $Q_{ss}$ in the oxide film near the interface between the oxide film and the semiconductor can accurately be obtained from the measurement results of the MOS capacitance.

When the wavelength of the light from the illuminant is at laest 500 nm, an energy exceeding the band gap energy of the silicon MOS device is introduced into a certain depth in the silicon semiconductor to promote the generation of hole-electron pairs and further internal minority carriers.

The present invention is also applicable to a MIS device.

Other objects, features and advantages of the present invention will be apparent from a consideration of the following description, taken in connection with the accompanying drawings.

DETAILED DESCRIPTION OF THE PREFERRED EMBODIMENTS

Figure 1:
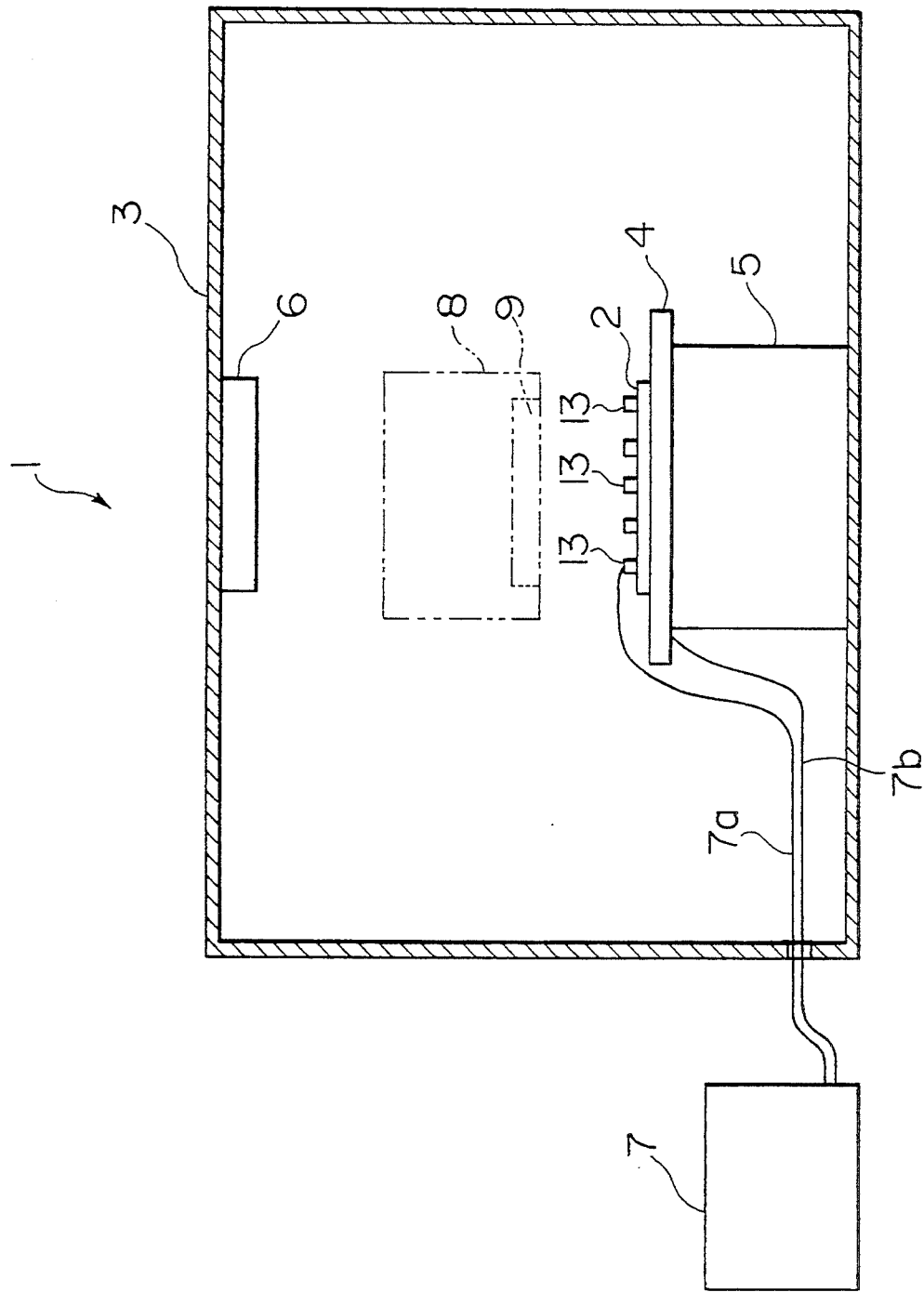
FIG. 1 shows a schematic diagram of an apparatus for measuring the high-frequency C-V characteristics of a MOS device.
Figure 2:
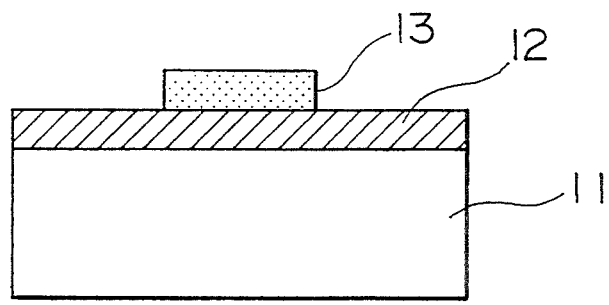
FIG. 2 shows a cross section of the MOS device of which the high-frequency C-V characteristics is to be measured.

Embodiments of the present invention will be described with reference to the drawings hereinafter. In FIG. 1, a silicon semiconductor wafer is indicated at 2. The wafer 2 is a sample of which the MOS capacitance is to be measured. The wafer 2 has a MOS capacitor as a MOS device fabricated thereon. As shown in FIG. 2, the MOS capacitor comprises, e.g., a p-type silicon substrate 11, an oxide film 12 grown on the top surface of the substrate 11, and gate electrodes 13 of polysilicon or aluminum deposited on a portion of the oxide film 12.

As shown in FIG. 1, a high-frequency C-V characteristics measuring apparatus 1 comprises a shading and radiation sielding box i.e. shielding-box 3, a wafer stage 4 on which the wafer 2 is placed, a stage support 5 fixed to the bottom of the shielding-box 3, an illuminant 6 right above the wafer stage 4 and fixed to the ceiling of the shielding-box 3, and a capacitance versus voltage (C-V) meter 7 provided outside the shielding-box 3 and having two lead cables 7a and 7b the front ends of which have probes.

Figure 3:
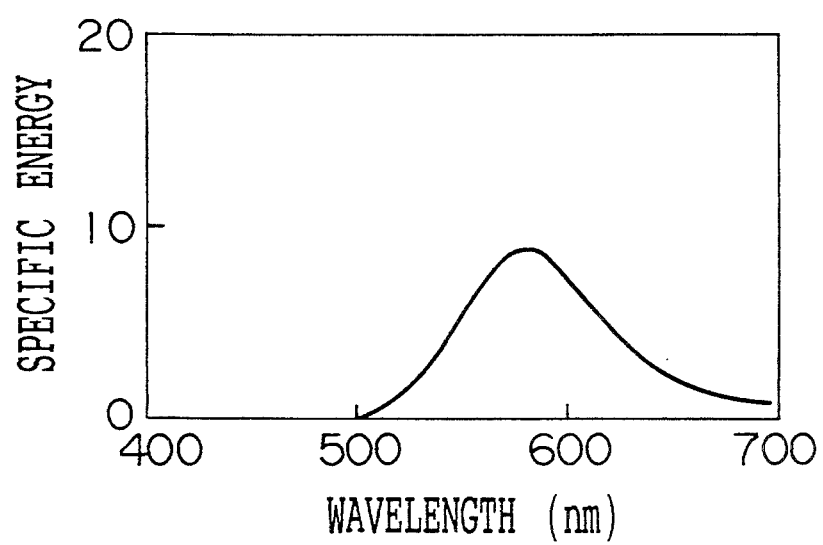
FIG. 3 shows a spectral energy distribution of a light employed in the measurement of the high-frequency C-V characteristics.
Figure 4:
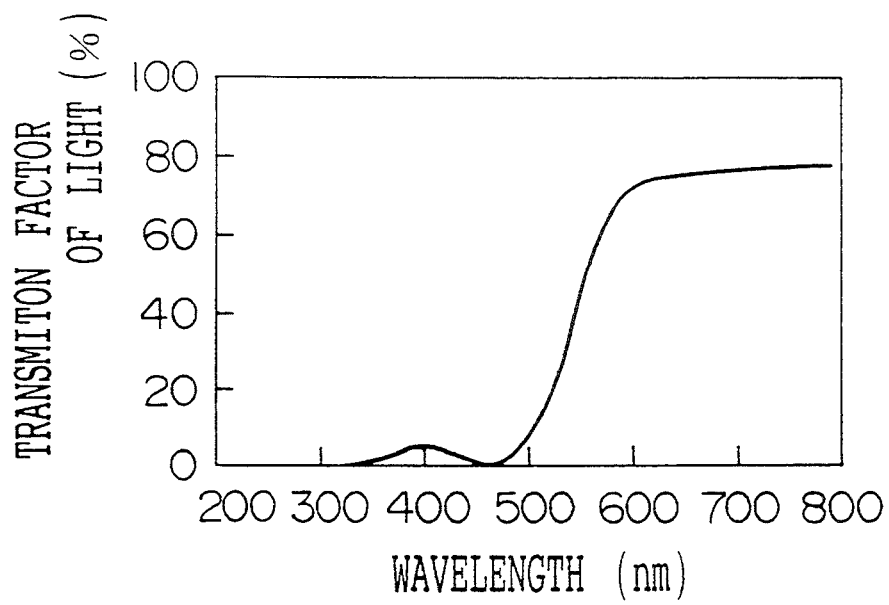
FIG. 4 shows the transmission factor of light of a wavelength selection filter cutting off a light of less than 500 nm wavelength.

The shielding-box 3 is made of stainless steel. However, a material for the shielding-box 3 is not restricted. The shielding box 3 intercepts natural light, light form incandescent and fluorescent lamps, etc. The stage support 5 contains a vacuum chuck sucking the wafer 2 to fasten it to the wafer stage 4. As shown in FIG. 3, the illuminant 6 emits a light of 500 nm to 700 nm wavelength, preferably, 500 nm to 700 nm wavelength, i.e., yellow light, to the top surface of the wafer 2 with a uniform illuminance. In case of the MOS device derived from silicon semiconductor, the illuminant 6 may emit a light of at least 500 nm wavelength. In the measurement of the high-frequency C-V characteristics, a controller (not shown) controls the illuminant 6 to automatically illuminate the top surface of the wafer 2. Alternatively, the illuminant 6 may be manually controlled. Alternatively, a lamp 9 of a microscope 8 employed for confirming an attachment of one probe from the lead cable 7a to a gate electrode 13 may be employed in place of the illuminant 6. Alternatively, the illuminant 6 and the lamp 9 of the microscope 8 may comprise an incandescent lamp (not shown) and a wavelength selection filter (not shown) cutting off a light of less than 500 nm wavelength and passing a light of a 600 nm or more wavelength at 60% or more transmission factor of light, as shown in FIG. 4.

The C-V meter 7 measures the MOS capacitance between the gate electrode 13 and the underside or backside of the substrate 11. The probe at the front end of the lead 7a is connected with the gate electrode 13 and the probe at the front end of the lead 7b is connected with the backside of the substrate 11. The C-V meter 7 is designed to apply a pulse voltage of, e.g., 1-MHz frequency and, e.g., a 3-V sweep width as a measuring signal to the gate electrode 13 and pick up a vector voltage produced across and a vector current passing through the MOS capacitor to measure the MOS capacitance.

In operation, the wafer 2 is placed on the wafer stage 4 and the probes of the C-V meter 7 are connected with the gate electrode 13 and the backside of the wafer 2. Subsequently, in order to measure the high-frequency C-V characteristics by means of the apparatus 1, the illuminant 6 emits the light of 500 nm to 700 nm wavelength and the C-V meter 7 outputs a predetermined pulse voltage and detects a resulting vector voltage and a resulting vector current.

Figure 5:
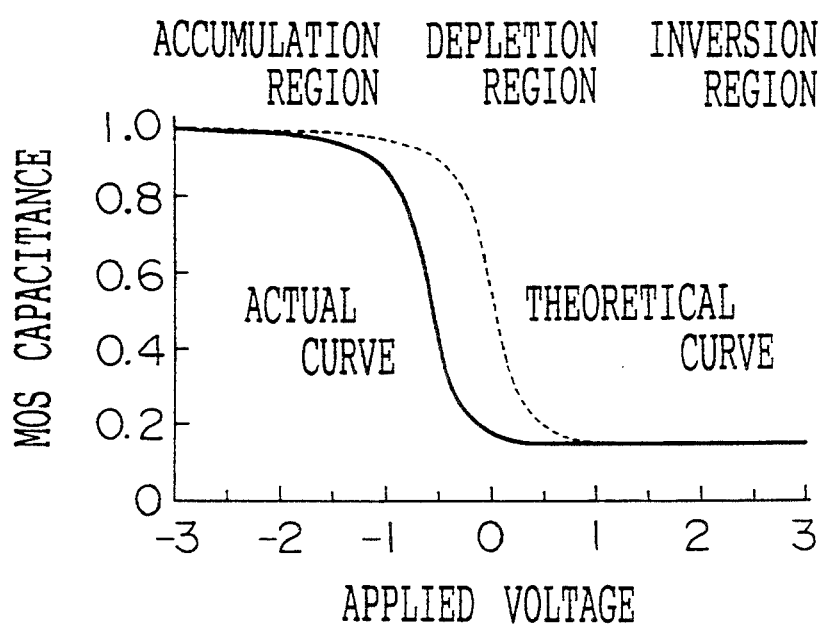
FIG. 5 shows an actual high-frequency C-V curve produced by a method and the apparatus of FIG. 1 and a corresponding theoretical high-frequency C-V curve.
Figure 6:
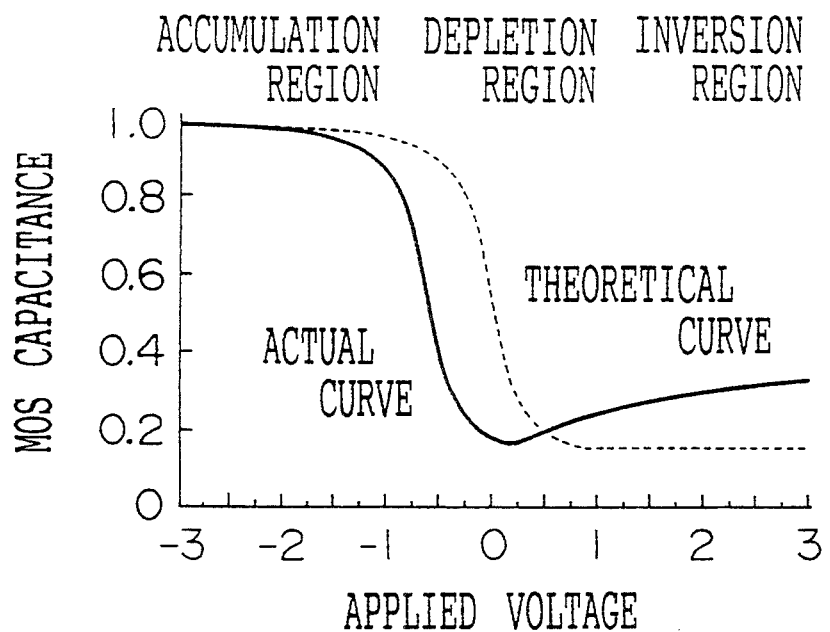
FIG. 6 shows an actual high-frequency C-V curve obtained by a prior-art method and an apparatus for measuring the high-frequency C-V characteristics under a light of a fluorescent lamp and the corresponding theoretical high-frequency C-V curve.
Figure 7:
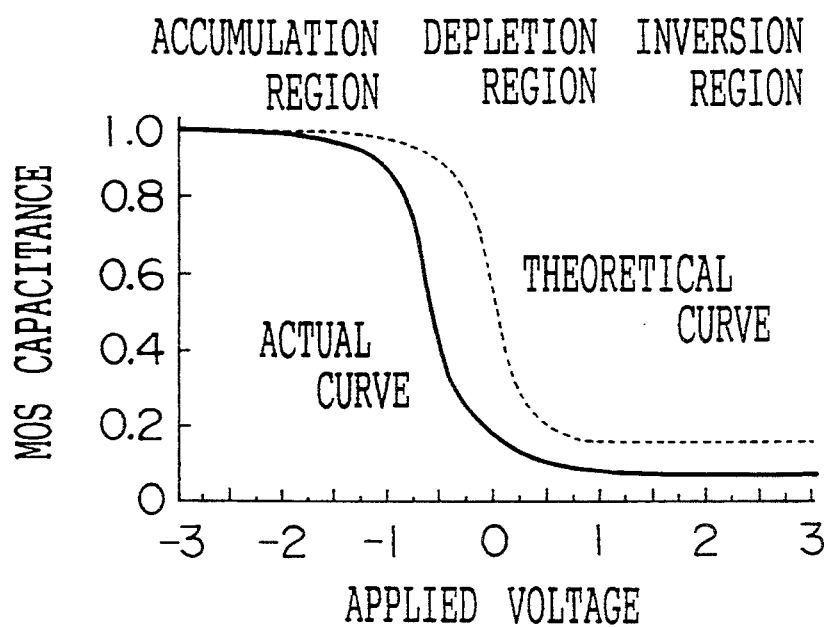
FIG. 7 shows an actual high-frequency C-V curve obtained by a prior-art method and an apparatus for measuring the high-frequency C-V characteristics with the MOS device shielded from light and a corresponding theoretical high-frequency C-V curve.

Results of the measurement of the high-frequency C-V characteristics by means of the apparatus 1 will be described with reference to FIG. 5 hereinafter. FIG. 5 shows a theoretical high-frequency C-V curve in dotted line and an actual high-frequency C-V curve in solid line. In the measurement, the applied voltage to the gate electrode 13 is gradually increased from the accumulation to the inversion and successively vice versa. FIG. 5 shows the actual high-frequency C-V curve in good accordance with the theoretical high-frequency C-V curve except the range corresponding the depletion layer. This indicates that the measurement of the high-frequency C-V characteristics of the MOS capacitor is accurately carried out. Especially, in the range corresponding to the inversion layer in which the prior-art measuring apparatus cannot accurately measure the high-frequency C-V characteristics, the actual high-frequency C-V curve is in good accordance with the theoretical high-frequency C-V curve. This indicates that an optimum number of minority carriers induced by the light from the illuminant 6 for the formation of the inversion layer at the surface of the substrate 11 quickly follow the sweep speed of the applied voltage to the gate electrode 13 and the induction of excess minority carriers at the surface of the substrate 11 are prevented so that the equilibrium of the inversion layer is maintained.

A translational difference between the actual and theoretical high-frequency C-V characteristics curves in the range corresponding to the depletion layer is due to an oxide charge and a work function difference between the gate electrode 13 and the wafer 2 (see J. Electrochem. Soc.: SOLID STATE SCIENCE, Vol. 114, No. 3, March 1967, pp. 266–273).

The present invention is not restricted to the above embodiment. For example, the high-frequency C-V characteristics of the MOS device may alternatively be measured in a highly-shading measuring room instead of in the shielding-box 3 using a light of 500 nm to 700 nm wavelength. In this case, an illuminant may comprise an incandescent lamp and a wavelength selection filter passing the light of at least 500 nm wavelength.

The embodiment has described the case in which the silicon substrate is employed as the semiconductor substrate 11 and the light of 500 nm or more wavelength is employed. In addition, the present invention employs a light of 1200 nm or more wavelength in measuring the high-frequency C-V characteristics of a germanium MOS device, a light of 800 nm or more wavelength in measuring that of a gallium-arsenide MOS device, and a light of 850 nm or more wavelength in measuring that of an indium phosphide MOS device.

The present invention is not rigidly restricted to the embodiments described above. It is to be understood that a person skilled in the art can easily change and modify the present invention without departing from the scope of the invention defined in the appended claims.

What is claimed is:

1. A method of measuring the high-frequency C-V characteristics of a MIS device, comprising the steps of:
   illuminating the MIS device by means of an illuminant emitting a light having long wavelengths, wherein short wavelengths that generate excess minority carriers at a semiconductor surface of the MIS device are eliminated to form and maintain an equilibrium of an inversion layer of the semiconductor surface;
   applying a voltage with a high-frequency signal to a gate electrode of the MIS device; and
   measuring the MIS capacitance of the MIS device receiving said voltage.

2. The method as recited as in claim 1, wherein said illuminant comprises a light source and a filter passing a component of light from the light source.

3. The method as recited in claim 1, wherein the light has a wavelength of at least 500 nm when the MIS device is derived from a silicon wafer.

4. The method as recited in claim 1, wherein the light has a wavelength of at least 1200 nm when the MIS device is derived from a germanium wafer.

5. The method as recited in claim 1, wherein the light has a wavelength of at least 800 nm when the MIS device is derived from a gallium-arsenide wafer.

6. The method as recited in claim 1, wherein the light has a wavelength of at least 850 nm when the MIS device is derived from an indium-phosphide wafer.

7. An apparatus for measuring the high-frequency C-V characteristics of a MIS device, comprising:
   a shielding-box shielding the MIS device from an outside electromagnetic radiation;
   an illuminant for illuminating a surface of the MIS device, the illuminant provided within said shielding-box and emitting a light having long wavelengths, wherein short wavelengths that generate excess minority carriers at a semiconductor surface of the MIS device are eliminated to form and maintain an equilibrium of an inversion layer of the semiconductor surface;
   means for applying a voltage with a high-frequency signal to a gate electrode of the MIS device; and
   means for measuring the MIS capacitance of the MIS device receiving said voltage.

8. The apparatus as recited as in claim 7, wherein said illuminant comprises a light source and a filter passing a component of light from the light source.

9. The apparatus as recited in claim 7, wherein the light has a wavelength of at least 500 nm when the MIS device is derived from a silicon wafer.

10. The apparatus as recited in claim 7, wherein the light has a wavelength of at least 1200 nm when the MIS device is derived from a germanium wafer.

11. The apparatus as recited in claim 7, wherein the light has a wavelength of at least 800 nm when the MIS device is derived from a gallium-arsenide wafer.

12. The apparatus as recited in claim 7, wherein the light has a wavelength of at least 850 nm when the MIS device is derived from an indium-phosphide wafer.

13. The apparatus as recited as in claim 8, wherein the light source comprises an incandescent lamp.

14. The apparatus as recited as in claim 8, wherein the light source comprises a fluorescent lamp.

15. An apparatus for measuring the high-frequency C-V characteristics of a MIS capacitor, comprising:
   a shielding-box shielding the MIS capacitor from an outside electromagnetic radiation, said shielding-box having a top wall and a bottom wall;
   a support mounted to an interior surface of the bottom wall and supporting the MIS capacitor;
   an illuminant for illuminating a surface of the MIS capacitor, the illuminant provided within said shielding-box and illuminating the MIS capacitor with a light having long wavelengths, wherein short wavelengths that generate excess minority carriers at a semiconductor surface of the MIS capacitor are eliminated to form and maintain an equilibrium of an inversion layer of the semiconductor surface; and
   a C-V meter applying a voltage with a high-frequency signal to a gate electrode of the MIS capacitor and changing a sweep direction of said voltage of a sweep width, said C-V meter picking up a vector voltage produced across and a vector current passing through the MIS capacitor to measure the MIS capacitance of the MIS capacitor.

16. The apparatus as recited as in claim 7, wherein said illuminant comprises a light source and a filter passing a component of light from the light source so that the transmission factor of said component is at least 60%.

17. A method of measuring the high-frequency C-V characteristics of a MIS device, comprising the steps of:
   providing a shielding-box shielding the MIS device from an outside electromagnetic radiation;
   illuminating the MIS device by means of an illuminant emitting a light having long wavelengths, wherein short wavelengths that generate excess minority carriers at a semiconductor surface of the MIS device are eliminated to form and maintain an equilibrium of an inversion layer of the semiconductor surface;
   applying a voltage with a high-frequency signal to a gate electrode of the MIS device; and
   measuring the MIS capacitance of the MIS device receiving said voltage.

18. The method as recited in claim 17, wherein the light has a wavelength of at least 500 nm when the MIS device is derived from a silicon wafer.

19. The method as recited in claim 17, wherein the light has a wavelength of at least 1200 nm when the MIS device is derived from a germanium wafer.

20. The method as recited in claim 17, wherein the light has a wavelength of at least 800 nm when the MIS device is derived from a gallium-arsenide wafer.

21. The method as recited in claim 17, wherein the light has a wavelength of at least 850 nm when the MIS device is derived from an indium-phosphide wafer.

22. A method of measuring the high-frequency C-V characteristics of a MIS device comprising:
   a step of illuminating the MIS device with a light having long wavelengths, wherein short wavelengths that generate excess minority carriers at a semiconductor surface of the MIS device are eliminated to form and maintain an equilibrium of an inversion layer of the semiconductor surface;
   a step of applying a voltage with a high-frequency signal to a gate electrode of the MIS device; and a step of measuring the MIS capacitance of the MIS device receiving said voltage.

23. An apparatus for measuring the high-frequency C-V characteristics of a MIS device, comprising:
means for shielding the MIS device from an outside electromagnetic radiation;
means for illuminating a surface of the MIS device, the means for illuminating provided within said means for shielding and using a light having long wavelengths, wherein short wavelengths that generate excess minority carriers at a semiconductor surface of the MIS device are eliminated to form and maintain an equilibrium of an inversion layer of the semiconductor surface;
means for applying a voltage with a high-frequency signal to a gate electrode of the MIS device; and
means for measuring the MIS capacitance of the MIS device receiving said voltage.

* * * * *